United States Patent [19]
Liu et al.

[11] Patent Number: 5,981,999
[45] Date of Patent: Nov. 9, 1999

[54] POWER TRENCH DMOS WITH LARGE ACTIVE CELL DENSITY

[75] Inventors: Chung-Min Liu; Chien-Chung Hung; Ming-Jinn Tsai; Ming-Jer Kao; June-Min Yao, all of Hsinchu, Taiwan

[73] Assignee: Industrial Technology Research Institute, Hsin-Chu, Taiwan

[21] Appl. No.: 09/226,278

[22] Filed: Jan. 7, 1999

[51] Int. Cl.$^6$ .................................................. H01L 29/10
[52] U.S. Cl. ........................ 257/339; 257/341; 257/335
[58] Field of Search .................................. 257/341, 339, 257/331, 330, 141, 335, 336, 334, 328

[56] References Cited

U.S. PATENT DOCUMENTS

| | | | |
|---|---|---|---|
| 5,410,170 | 4/1995 | Bulucea et al. | 257/332 |
| 5,420,450 | 5/1995 | Yoneda et al. | 257/341 |
| 5,468,982 | 11/1995 | Hshieh et al. | 257/331 |
| 5,623,152 | 4/1997 | Majumdav et al. | 257/331 |
| 5,629,543 | 5/1997 | Hshieh et al. | 257/330 |
| 5,639,676 | 6/1997 | Hshieh et al. | 437/40 |
| 5,682,048 | 10/1997 | Shinohara et al. | 257/331 |
| 5,796,125 | 8/1998 | Matsudai et al. | 257/141 |
| 5,844,277 | 12/1998 | Hshieh et al. | 257/341 |
| 5,877,528 | 3/1999 | So | 257/341 |
| 5,914,503 | 6/1999 | Iwamuro et al. | 257/330 |

OTHER PUBLICATIONS

Williams et al., A 1 Million–Cell 2.0 M–ohm 30–V Trench FET Utilizing 32 Mcell/in 2 Density with Distributed Voltage Clamping, IEDM 97 — pp. 363–366.

*Primary Examiner*—Donald L. Monin, Jr.
*Attorney, Agent, or Firm*—George O. Saile; Stephen B. Ackerman

[57] ABSTRACT

A design for a trench DMOS transistor having improved current carrying capability is presented. The principal improvement lies in the periodic replacement of the individual cells in the array with a protection cell of a different size. When this is done it becomes possible to significantly increase the density of cells per unit area. This results in a corresponding improvement in the amount of channel area available to the device and hence an increase in its current carrying capability.

14 Claims, 4 Drawing Sheets

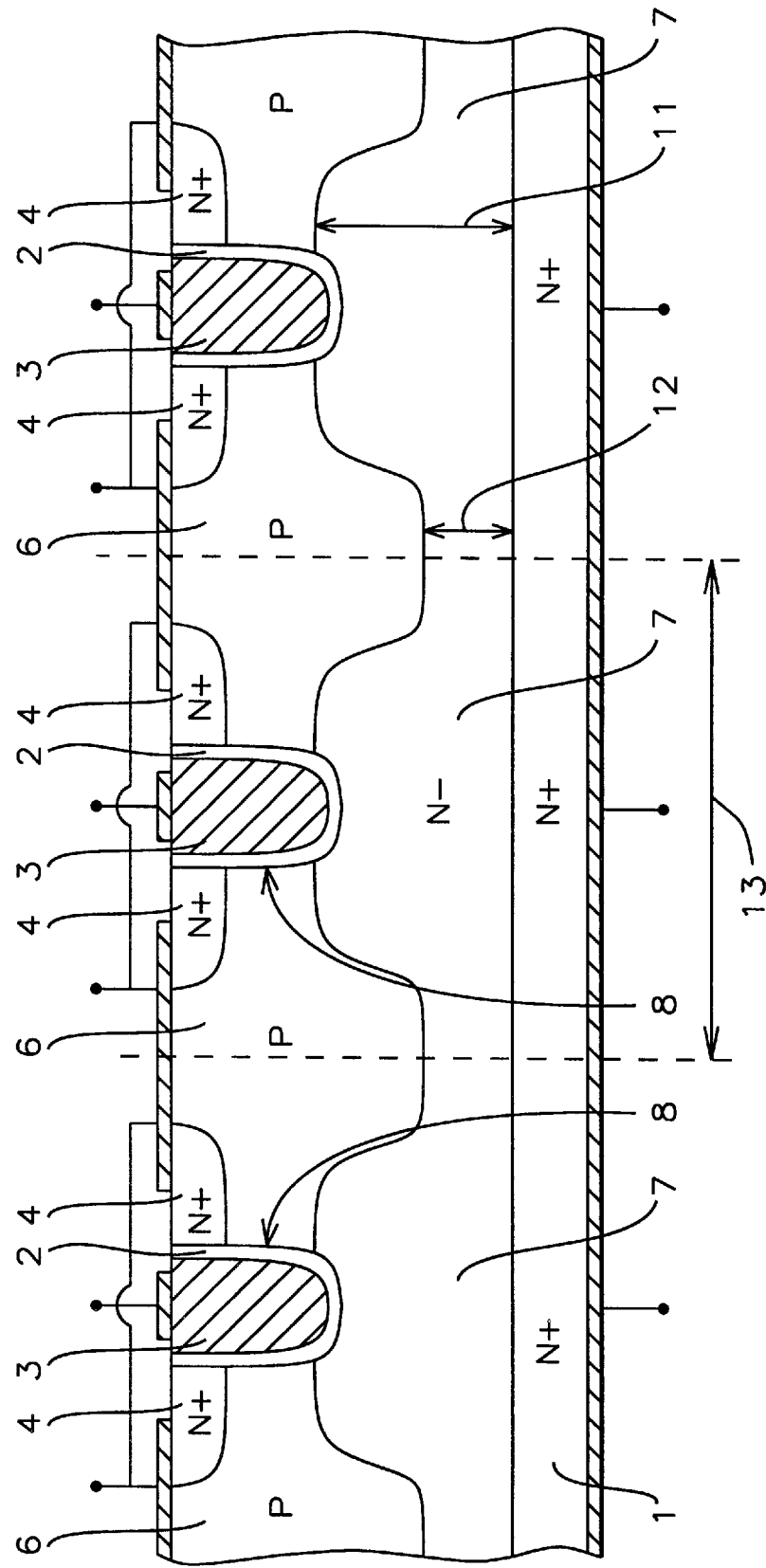
FIG. 1 – Prior Art

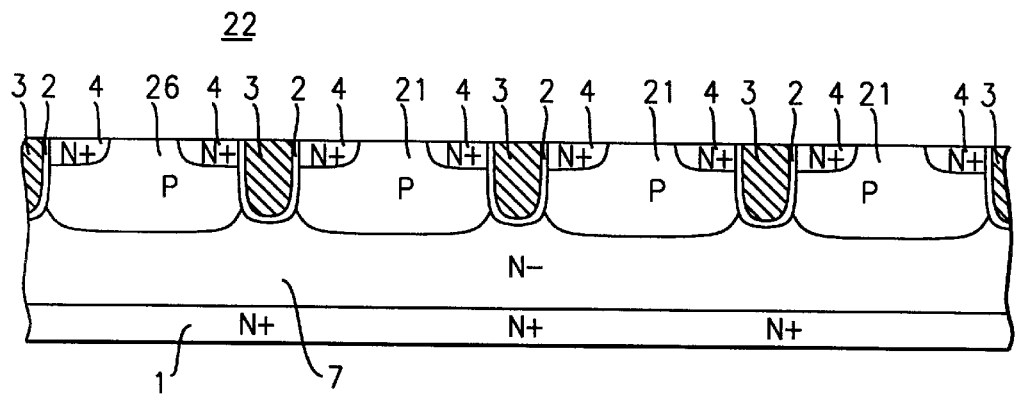
FIG. 2 - Prior Art
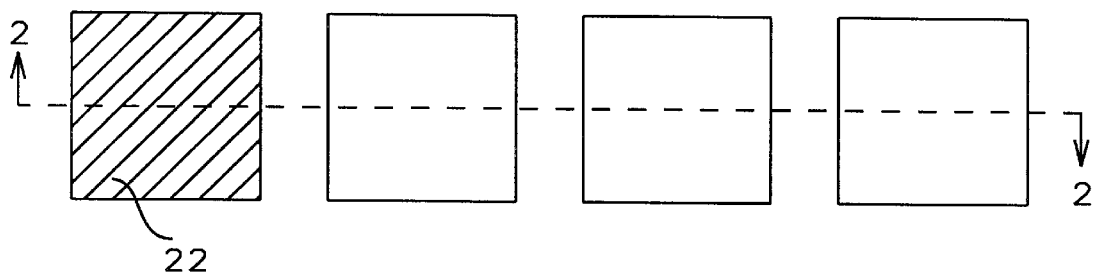
FIG. 3 - Prior Art
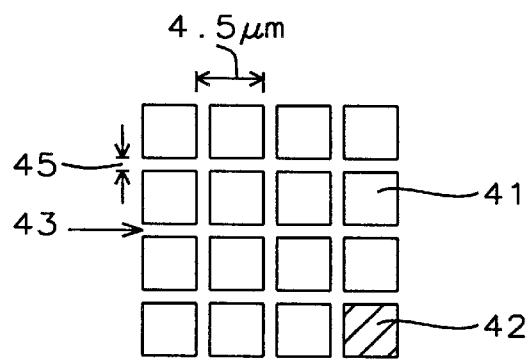
FIG. 4 - Prior Art

POWER TRENCH DMOS WITH LARGE ACTIVE CELL DENSITY

FIELD OF THE INVENTION

The invention relates to the general field of high power solid-state devices with particular reference to DMOS transistors with high current carrying capacity and controlled voltage breakdown.

BACKGROUND OF THE INVENTION

In order for field effect devices to be able to handle large currents and voltages it becomes necessary for the active regions of such devices to be significantly larger than those used for their counterparts in more conventional applications involving low power. One structure in which this has been achieved, without adding large amounts to the area that is occupied by the device, has been the trench DMOS (double diffusion metal oxide semiconductor) transistor.

An example of such a device is shown in schematic cross-section in FIG. 1. Layer 1 of N+ material is formed at the lower surface of a silicon wafer. Deep trenches in a criss-cross grid-like pattern are etched in the upper surface of the wafer. The walls of these trenches are lined with a layer of dielectric 2, typically silicon oxide, following which they are filled with polysilicon 3. The latter will serve as the gate electrode while layer 2 will serve as the gate oxide. A source region consisting of N+ silicon 4 is formed on either side of gate oxide 2.

Surrounding source 4, and most of the trench, is a body of P type silicon 6. The space between the body 6 and drain layer 1 comprises N− material 7. The device operates like a normal field effect transistor—no current will flow between source 4 and drain 1 until a positive voltage is applied to gate 3, setting up a field across gate dielectric 2 and resulting in the formation of a conductive channel in the active region pointed to by arrow 8. Once this active region becomes N type, current from source 4 is able to traverse P body 6 and enter region 7. The latter includes a drift field which results in the acceleration of electrons over to drain layer 1.

Since the thickness of P body 6 must be kept relatively small in order to provide an optimum channel length for the active region, the separation between P body 6 and drain region 1 is as shown by arrows 11. However, this arrangement causes the device to break down in the vicinity, of the corner of oxide layer 2 first, when sufficient voltage is applied. Breakdown of this type will reduce the device reliability, is destructive, and is to be avoided at all costs. To overcome this problem, P body 6 is shaped so that a part of it extends downwards in selected places thereby reducing the separation between P body 6 and drain 1 at these locations, symbolized by arrows 12. Under these conditions, PN junction breakdown will occur at the interface between 6 and 7 before the gate oxide layer to can be destroyed.

We note that the full device is made up of a series of individual cells, whose width is defined here by arrows 13, arranged as a continuous linear or two-dimensional array.

The major disadvantage of the design illustrated in FIG. 1 is that the cell pitch can be reduced only slightly because of the lateral diffusion of deep P body 6.

In order to overcome this problem the design shown FIG. 2 has been widely adopted in the art. Cells 21, which we will henceforth refer to as active cells, are similar to the cells seen in FIG. 1. Cell 22, henceforth referred to as a protection cell, is shown at one end of the array. Its main distinguishing difference from the active cells is that its P body 26 extends further into N− region 7 than do the active cells, thereby guaranteeing that breakdown will always occur there.

A plan view of the structure is shown in FIG. 3, FIG. 2 being a cross-section of FIG. 3 taken at 2—2. The protection cell is periodically located within the array. In this case, one of every four cells is a protection cell. FIG. 4 shows the arrangement of FIG. 2 in a two-dimensional array of active cells such as a 41 and including one protection cell 42. This design is widely used in the prior art. Note that the dimensions of the protection cell are the same as those of the active cells. This leads to a cell pitch of about 4.5 microns corresponding to a cell density of about 32 million cells per square inch. The separation 45 between cells is typically about 1 micron. Neither the cell density nor the separation between cells is limited by technological considerations, rather these quantities are determined by the need to make the active cells the same size as the protection cell (whose dimension is limited by the simultaneously formed lateral diffusion distance when P body 26 is vertically driven in), in order not to lose the regular array format.

During a routine search of the prior art no references that solve the problem of increasing the array density in the matter taught by the present invention were uncovered. Several references of interest were, however, encountered. For example, Hsieh et al. (U.S. Pat. No. 5,629,543) provide P+ regions that extend into the drift region while the drain region immediately below it extends upwards. Hsieh et al. (U.S. Pat. No. 5,468,982) avoid breakdown at the intersections between the trenches by not forming the N+ source regions there. Bulucea et al. (U.S. Pat. No. 5,410,170) describe several different cell geometries which make for more efficient operation, and Hsieh et al. (U.S. Pat. No. 5,639,676) describe a process for manufacturing a DMOS array using fewer process steps than the prior art.

SUMMARY OF THE INVENTION

It has been an object of the present invention to provide a design for a DMOS device having high current carrying capacity and controlled breakdown voltage.

Another object of the invention has been that said device be manufacturable using conventional methods.

These objects have been achieved by replacing one of the individual cells present in a typical DMOS array with a larger protection cell. When this is done it becomes possible to significantly increase the density of active cells per unit area. This results in a corresponding improvement in the amount of channel area available to the device and hence to an increase in its current carrying capability.

BRIEF DESCRIPTION OF THE DRAWINGS

FIG. 1 is a cross-section of part of a DMOS device illustrating the structure of three of the regular cells.

FIG. 2 shows a design of the prior art and how the problem of controlling breakdown voltage in the device is dealt with.

FIG. 3 is a plan view of the cross-section seen in FIG. 2.

FIG. 4 is a plan view of a conventional two-dimensional array showing how one protection cell replaces an active cell.

DESCRIPTION OF THE PREFERRED EMBODIMENTS

Figure 5:
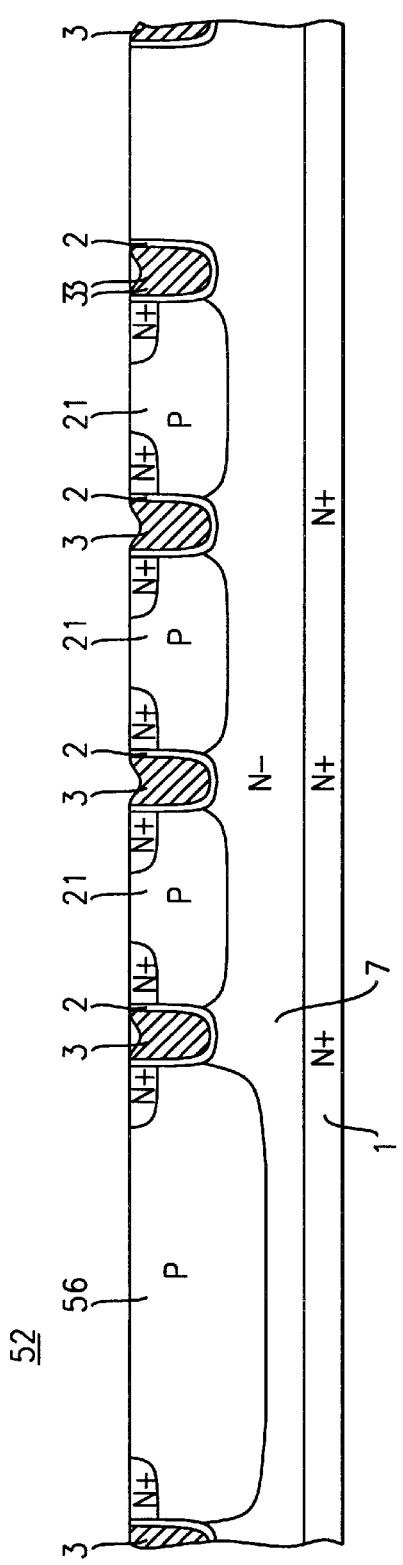
FIG. 5 is cross-section of a DMOS device according to the design of the present invention, showing how a larger protection cell is used.

In FIG. 4 we showed a two-dimensional array of active cells 41 containing one protection cell 42. Each cell in the array is separated from its neighbors by a trench such as 43. It is clear from simple geometric considerations that if the density of cells is increased the trench length per unit area will increase. Referring back for the moment to FIG. 1, we note that each trench length contributes a fixed amount of active channel width (arrow 8 in the figure) so that the total amount of active channel width will be proportional to the total trench length. Since the current carrying capacity of the full device is mainly determined by the available amount of channel width, it follows that a device having a longer trench per unit area will have a greater current carrying capability.

In our discussion of the prior art it was noted that the length of trenches per unit area was limited by the notion that the protection cell (42 in FIG. 4) needed to be identical in area to an active cell. The key feature of the present invention is that this notion has been discarded. Although the protection cell needs to have a minimum area (allowing for lateral diffusion of deep body 26) there is no fundamental reason why this minimum area needs to be the same as the area of an active cell.

Referring now FIG. 5, we show a cross-section of a part of the device similar to FIG. 2 except for the key difference that protection cell 52 is shown (in this example) as having twice the width of active cells such as 21. As in the prior art, the P body 56 extends downwards into drift region 7 to a greater depth than do the active cells. As a result, the P bodies of cells 21 are up to about 6 microns above the interface between drift region 7 and drain region 1 while a smaller corresponding distance for the P body of cell 52 is provided.

Figure 6:
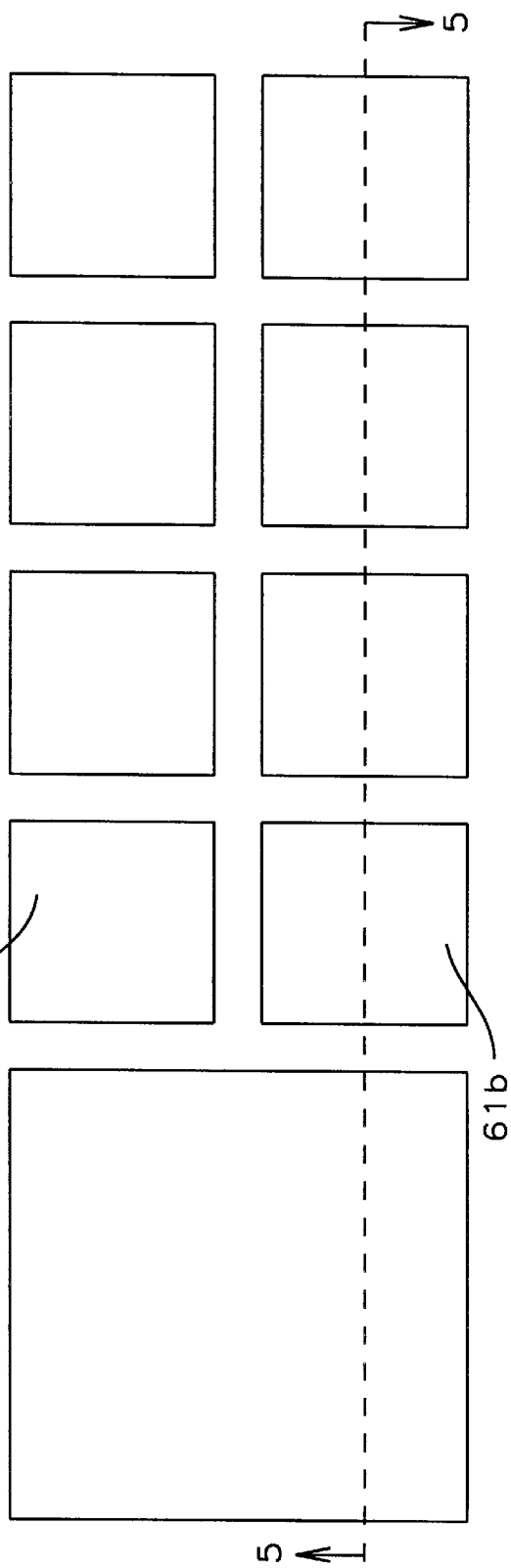
FIG. 6 is a plan view of the cross-section of FIG. 5, illustrating a linear array of pairs of active cells.

In order to maintain the regularity of the array, the protection cell 52 occupies an area that replaces one active cell. In FIG. 6 we show an example of a linear array made up of pairs of active cells, such as 61a and 61b, with protection cell 52 replacing two such pairs in the linear array. FIG. 5 is a section taken at 5—5 of FIG. 6.

Figure 7:
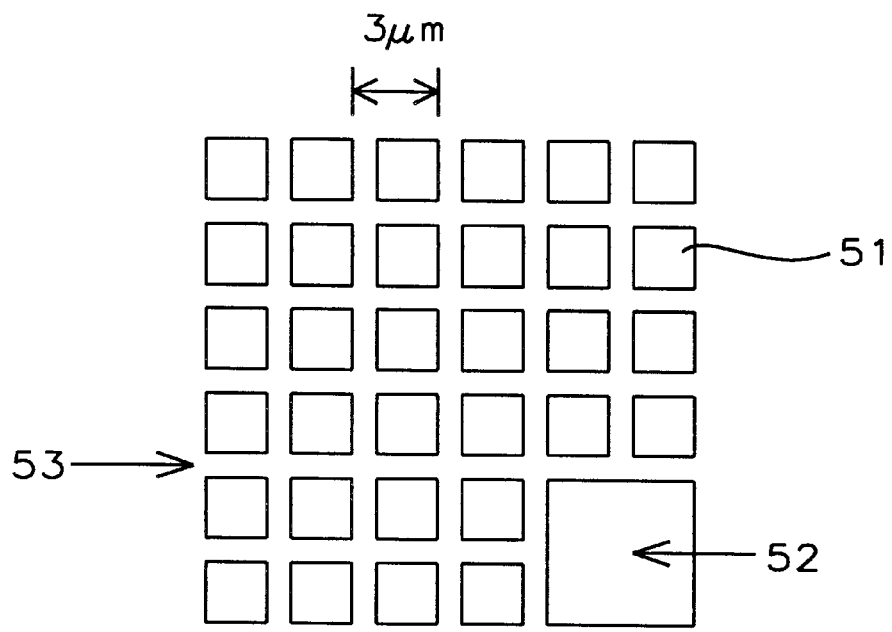
FIG. 7 is a plan view of a two-dimensional array showing how larger protection cells replace active cells.

In a more common embodiment of the invention a two-dimensional array such as shown in FIG. 7, was implemented. In this case the protection cell 52 has been placed in the lower right hand corner of the array and replaces four active cells. In this way the cell pitch could be reduced to less than 4.5 microns for an 0.8 micron process The cell pitch of the active cells can be seen as the distance, either in the X or Y direction, from the center of one cell to the center of the second cell. The pitch in the X and Y directions can be different.

Figure 8:
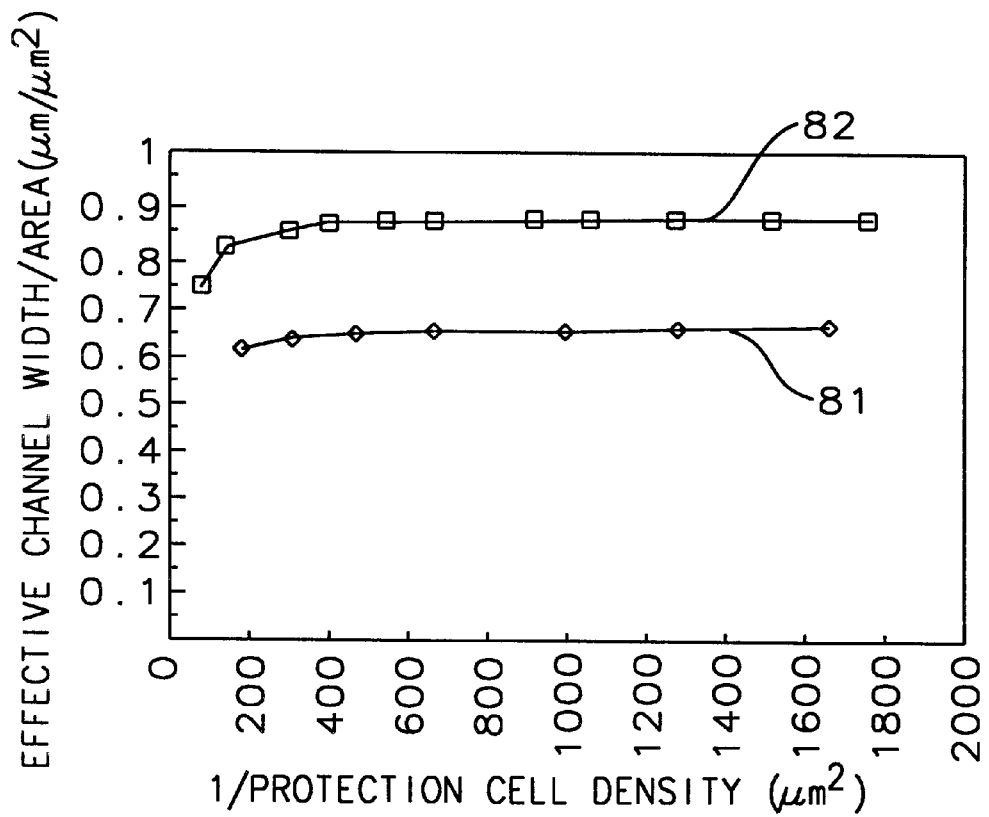
FIG. 8 is a plot of effective channel width per unit area as a function of protection cell density for a device of the prior art and for a device according to the present invention.

In the most general case, the number of active cells replaced by a protection cell would be between 2 and 16. The effect of replacing 4 active cells, rather that one cell as in the prior art, to form the protection cell, is illustrated in FIG. 8. A figure of merit that relates to current carrying ability (effective channel width)/(cell area), is plotted against the reciprocal of protection cell density (proportional to protection cell area). Curve 81 is for devices of the prior art design (1 protection cell replaces 1 active cell) while curve 82 is for a device built according to the present invention, in this instance 1 protection cell replacing 4 active cells with a pitch of 3 microns.

Thus, a key feature of the present invention is the ability to change the sizes of the active and protection cells independently. The size of the active cells can shrink to increase the total channel width and the size of the protection cell can be expanded (if necessary) to protect the device more effectively. Note that these effects are independent of how many active cells are replaced by one protection cell. Additionally, if the dimension of the protection cell expands, an $N^+$ source can be formed in the cell, which makes it conductive, and serves as an active cell for the on state case as well.

For a device having a cell density of 72 million cells per square inch in which a single protection cell replaced four active cells, given the P body-to-drain separation cited above, the maximum operating voltage was found to be between about 10 and 40 volts.

We note here that the width of trenches 43 is currently between about 0.6 and 1.5 microns. As technology improves and the areas of the active cells continue to shrink, the length of the trench (which is proportional to the channel width) per unit area will likewise be increased.

While the invention has been particularly shown and described with reference to the preferred embodiments thereof, it will be understood by those skilled in the art that various changes in form and details may be made without departing from the spirit and scope of the invention.

What is claimed is:

1. A high power solid-state device, comprising:
   a two-dimensional array of active DMOS cells each of which further comprises an N+ drain layer, and a first P type body which includes a first active region;
   a protection cell that replaces a quantity of active cells and that further comprises a second P type body;
   said first P type body being separated from the drain layer by a first distance that is no more than about 6 microns; and
   said second P type body being separated from the drain layer by a second distance that is less than said first distance.

2. The solid-state device of claim 1 wherein the active DMOS cells have a density that is greater than about 20 million cells per square inch.

3. The solid-state device of claim 1 wherein the quantity of active cells replaced by the active cell is between 1 and 16.

4. The solid-state device of claim 1 wherein all cells are separated by a trench that is lined with gate insulation and filled with polysilicon.

5. The solid-state device of claim 1 having a maximum operating voltage that is between about 10 and 40 volts.

6. The solid-state device of claim 1 wherein said second distance is less than about 6 microns.

7. The solid-state device of claim 1 wherein the active DMOS cells have a rectangular or a hexagonal shape.

8. The solid-state device of claim 1 wherein said protection cell contains a second active region.

9. A high power solid-state device, comprising:

an array of active DMOS cells each of which further comprises an N+ drain layer, and a first P type body which includes a first active region;

said first P type body being separated from the drain layer by a first distance that is no more than about 4 microns;

a protection cell that replaces an active cell in the array and that further comprises a second P type body; and said second P type body being separated from the drain layer by a second distance that is less than said first distance.

10. The solid-state device of claim 9 wherein the protection DMOS cells have a linear density of between about ½ and ¹⁄₁₆ cell pairs per active cell.

11. The solid-state device of claim 9 wherein all cells are separated by a trench that is lined with gate insulation and filled with polysilicon.

12. The solid-state device of claim 9 having a maximum operating voltage that is between about 10 and 40 volts.

13. The solid-state device of claim 9 wherein said second distance is less than about 6 microns.

14. The solid-state device of claim 9 wherein said protection cell contains a second active region.

* * * * *